United States Patent [19]
Elliott

[11] Patent Number: 5,999,013
[45] Date of Patent: Dec. 7, 1999

[54] METHOD AND APPARATUS FOR TESTING VARIABLE VOLTAGE AND VARIABLE IMPEDANCE DRIVERS

[75] Inventor: John Robert Elliott, Rochester, Minn.

[73] Assignee: International Business Machines Corporation, Armonk, N.Y.

[21] Appl. No.: 09/060,479

[22] Filed: Apr. 15, 1998

[51] Int. Cl.[6] .................................................. H03K 19/00
[52] U.S. Cl. .............................................. 326/16; 326/56
[58] Field of Search .................................. 326/16, 31, 56, 326/82, 86, 90; 327/407; 702/57, 64, 65, 117, 118, 120

[56] References Cited

U.S. PATENT DOCUMENTS

| | | | |
|---|---|---|---|
| 4,841,232 | 6/1989 | Graham et al. | 324/73 R |
| 5,107,230 | 4/1992 | King | 333/32 |
| 5,783,963 | 7/1998 | Garnett et al. | 327/306 |

Primary Examiner—Michael Tokar
Assistant Examiner—Anh Q Tran
Attorney, Agent, or Firm—Joan Pennington

[57] ABSTRACT

A tristate driver/receiver test circuit and an improved method are provided for parametric testing of variable voltage and variable impedance tristate driver and receiver circuits. The tristate driver/receiver test circuit includes a plurality of tristate driver/receiver pairs. The plurality of tristate driver/receiver pairs represent a plurality of parametrics including multiple voltage and impedance levels. A decoder having an input and an output enables one of the plurality of tristate driver/receiver pairs. The decoder output includes a plurality of decoder output lines. Each decoder output line is coupled to a respective one of the plurality of tristate driver/receiver pairs. Parametric select inputs are applied to the decoder input for selecting one of the plurality of tristate driver/receiver pairs. In the testing method, a first parametric test is performed. Then checking for special parametric tests is provided. Responsive to identifying special parametric tests, additional parametric tests are sequentially performed. The parametric select input is changed and an additional parametric test is performed until all parametrics are tested.

11 Claims, 5 Drawing Sheets

PARAMETRIC SELECT INPUTS

| A | B | C | M | DRIVER/RECEIVER |
|---|---|---|---|---|
| 0 | 0 | 0 | 0 | TSD (1)/ RCVR (1) |
| 0 | 0 | 1 | 0 | TSD (2)/ RCVR (2) |
| 0 | 1 | 0 | 0 | TSD (3)/ RCVR (3) |
| * | * | * | * | * * * * * |
| 1 | 1 | 1 | 1 | TSD (N)/ RCVR (N) |

FIGURE 3B

METHOD AND APPARATUS FOR TESTING VARIABLE VOLTAGE AND VARIABLE IMPEDANCE DRIVERS

FIELD OF THE INVENTION

The present invention relates to parametric testing of variable voltage and variable impedance tristate driver/receiver circuits, and more particularly, to a tristate driver/receiver test circuit and a method for parametric testing of variable voltage and variable impedance tristate driver and receiver circuits.

DESCRIPTION OF THE RELATED ART

To test a tristate driver/receiver circuit, a logical model of the circuit is created using test generation software tools. A test model which is used for testing a standard tristate driver/receiver circuit is shown in FIG. 1.

During manufacture of integrated circuits, manufacturers rely on sophisticated testers to test the chips via external pins. Typical manufacturing defects include shorts, opens, stuck-at-1, stuck-at-0, and the like. Test patterns are applied to the inputs of the circuit and responses measured at the output of the circuit on a tester. This process works very well for pure logical functions, but for circuits that contain analog type devices, this process does not always produce the best test.

The normal test generation process requires that only one pass of test generation be completed to build tests for testing the circuit parametrically. Normal test generation flow is shown in FIG. 2.

When additional inputs are added which perform an analog function, for example, to change voltage switching levels, the tristate driver/receiver circuit test model of FIG. 1 is inadequate because not all functions are tested. For example, a new type of tristate driver/receiver circuit is a variable voltage and variable impedance tristate driver/receiver circuit. The variable voltage and variable impedance tristate driver receiver circuit has additional inputs for selecting switching voltage levels, and/or impedance and/or switching speed and/or other physical characteristics. Since these inputs change the physical operating characteristics of the driver/receiver and not the logical function, they are not effectively described in the conventional logic level circuit model of FIG. 1 that is used for test generation. Hence test generation software cannot generate test patterns that properly test the variable voltage and variable impedance tristate driver and receiver circuits in all physical operating modes. One test method that has been used only provides one parametric test which does not test all of the operating parameters and portions of the circuit are left untested. To fully test the circuit, multiple passes of parametric tests are made at the tester, changing the inputs to the special driver/receivers and rerunning the entire parametric test.

A need exist for improved method and apparatus for parametric testing of variable voltage and variable impedance tristate driver and receiver circuits. It is desirable to build test patterns that specifically target the parametric faults in the drivers/receiver circuits without creating excessive number of test patterns, to keep the test time as short as possible while still providing a complete test.

SUMMARY OF THE INVENTION

Important objects of the present invention are to provide a tristate driver/receiver test circuit and an improved method for parametric testing of variable voltage and variable impedance tristate driver and receiver circuits; to provide such parametric testing apparatus and method substantially without negative effects and that overcome some disadvantages of prior art arrangements.

In brief, a tristate driver/receiver test circuit and an improved method are provided for parametric testing of variable voltage and variable impedance tristate driver and receiver circuits. The tristate driver/receiver test circuit includes a plurality of tristate driver/receiver pairs. The plurality of tristate driver/receiver pairs represent a plurality of parametrics including multiple voltage and impedance levels. A decoder having an input and an output enables one of the plurality of tristate driver/receiver pairs. The decoder output includes a plurality of decoder output lines. Each decoder output line is coupled to a respective one of the plurality of tristate driver/receiver pairs. Parametric select inputs are applied to the decoder input for selecting one of the plurality of tristate driver/receiver pairs. In the testing method, a first parametric test is performed. Then checking for any special parametric tests is provided. Responsive to identifying special parametric tests, additional parametric tests are sequentially performed. The parametric select input is changed and an additional parametric test is performed until all parametrics are tested.

BRIEF DESCRIPTION OF THE DRAWINGS

The present invention together with the above and other objects and advantages may best be understood from the following detailed description of the preferred embodiments of the invention illustrated in the drawings, wherein:

FIG. 3B is a table illustrating a selected tristate driver/receiver pair for different applied parametric select inputs to a decoder of the tristate driver/receiver test circuit of FIG. 3A.

DETAILED DESCRIPTION OF THE PREFERRED EMBODIMENTS

Figure 3A:
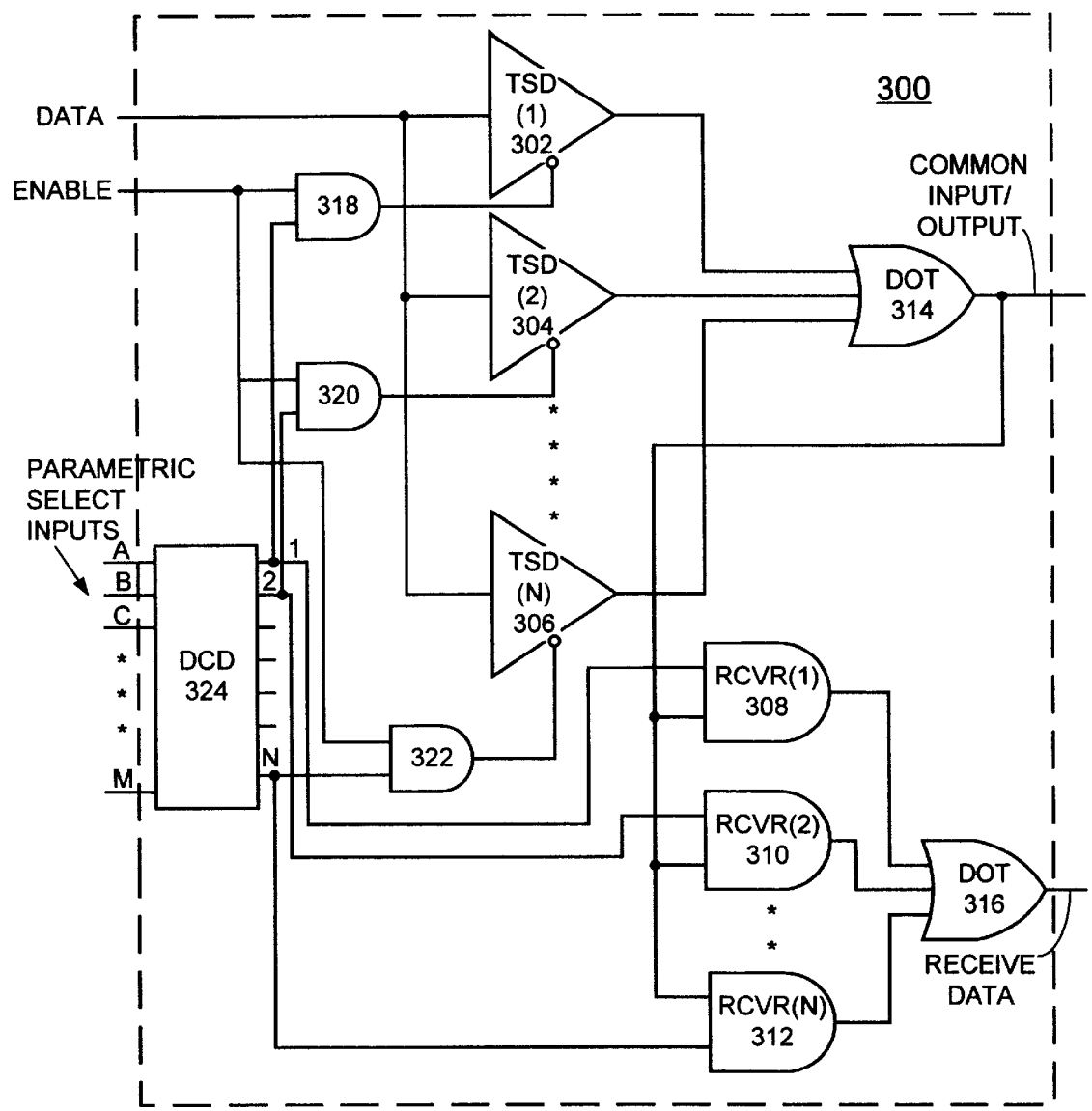
FIG. 3A is a logical test model of a tristate driver/receiver circuit in accordance with the preferred embodiment.

Having reference now to the drawings, in FIG. 3A there is shown a new type of tristate driver/receiver test circuit in accordance with the invention generally designated by the reference character 300. Tristate driver/receiver test circuit 300 includes a plurality of tristate driver (TSD) (1) 302, TSD (2) 304, and TSD (N) 306 and a corresponding plurality of receivers (RCVRs) RCVR (1) 308, RCVR (2) 310, RCVR (N) 312. An OR DOT 314 connects the output wires of the tristate drivers TSD (1) 302, TSD (2) 304, and TSD (N) 306 and provides a common tristate driver output at a line COMMON INPUT/OUTPUT. The tristate driver output is applied to 310, RCVR (N) 312. An OR DOT 316 connects the output wires of the receivers RCVR (1) 308, RCVR (2) 310, RCVR (N) 312 and provides a common receiver output at a line RECEIVE DATA. Data are applied to the tristate drivers TSD (1) 302, TSD (2) 304, and TSD (N) 306 at a line labeled DATA.

An external driver enable input at a line labeled ENABLE is applied to a first input of a plurality of dual input AND gates 318, 320, and 322. A decoder (DCD) 324 receives a plurality of parametric select inputs A, B, C through M and previous decoded outputs 1 through N. A respective output of AND gates 318, 320, and 322 and the second inputs of the receivers RCVR (1) 308, RCVR (2) 310, RCVR (N) 312. A respective output of AND gates 318, 320, and 322 provides a driver enable input to respective tristate drivers TSD (1) 302, TSD (2) 304, and TSD (N) 306. It should be understood that an external receiver enable input similarly can be ANDED with the respective decoded outputs 1 through N of decoder 324 for enabling the receivers RCVR (1) 308, RCVR (2) 310, RCVR (N) 312.

In accordance with features of the invention, tristate driver/receiver test circuit 300 is arranged with mutually exclusive gating for each of the multiple, parallel tristate driver/receiver pairs TSD (1) 302, RCVR (1) 302; TSD (2) 304, RCVR (2) 310; and TSD (N) 306, RCVR (N) 312. Each of the parallel tristate driver/receiver pairs TSD (1) 302, RCVR (1) 308; TSD (2) 304, RCVR (2) 310; and TSD (N) 306, RCVR (N) 312 represent a different parametric version or analog function of the tristate driver/receiver circuit to be tested. To change voltage switching levels, different ones of the tristate driver/receiver pairs are selected. For example, TSD (1) 302, RCVR (1) 308 can represent one voltage level and TSD (2) 304, RCVR (2) 310 can represent another voltage level and/or another driver output impedance. The multiple tristate driver/receiver pairs (1)—(N) represent each voltage and impedance combination to be tested.

Referring also be FIG. 3B, a truth table illustrates multiple values for the parametric select inputs A, B, C through M together with respectively selected tristate driver/receiver pairs TSD (1) 3302, RCVR (1) 308; TSD (2) 302, RCVR (2) 310; or TSD (N) 306, RCVR (N) 312. The external enable input at line ENABLE is enabled or set to 1. Tristate driver/receiver test circuit 300 provides a logic model that is minimal and provides a test for all parametric variations. A defined select line for variable impedance and/or variable voltage can only select one tristate driver/receiver pair at a time, so additional input/output pins are not required.

In accordance with features of the invention, multiple passes of parametric testing are performed to verify all the various combinations of the parametric select inputs A, B, C through M. Because each parametric version of the driver/receiver circuit is explicitly represented by tristate driver/receiver pairs (1)—(N) in the tristate driver/receiver test circuit 300, additional passes of parametric test generation utilizes generated test patterns that target only the faults in the selected driver/receiver circuits. The faults that have been covered in the previous passes can be ignored. Consequently the test pattern volume is reduced.

Figure 4:
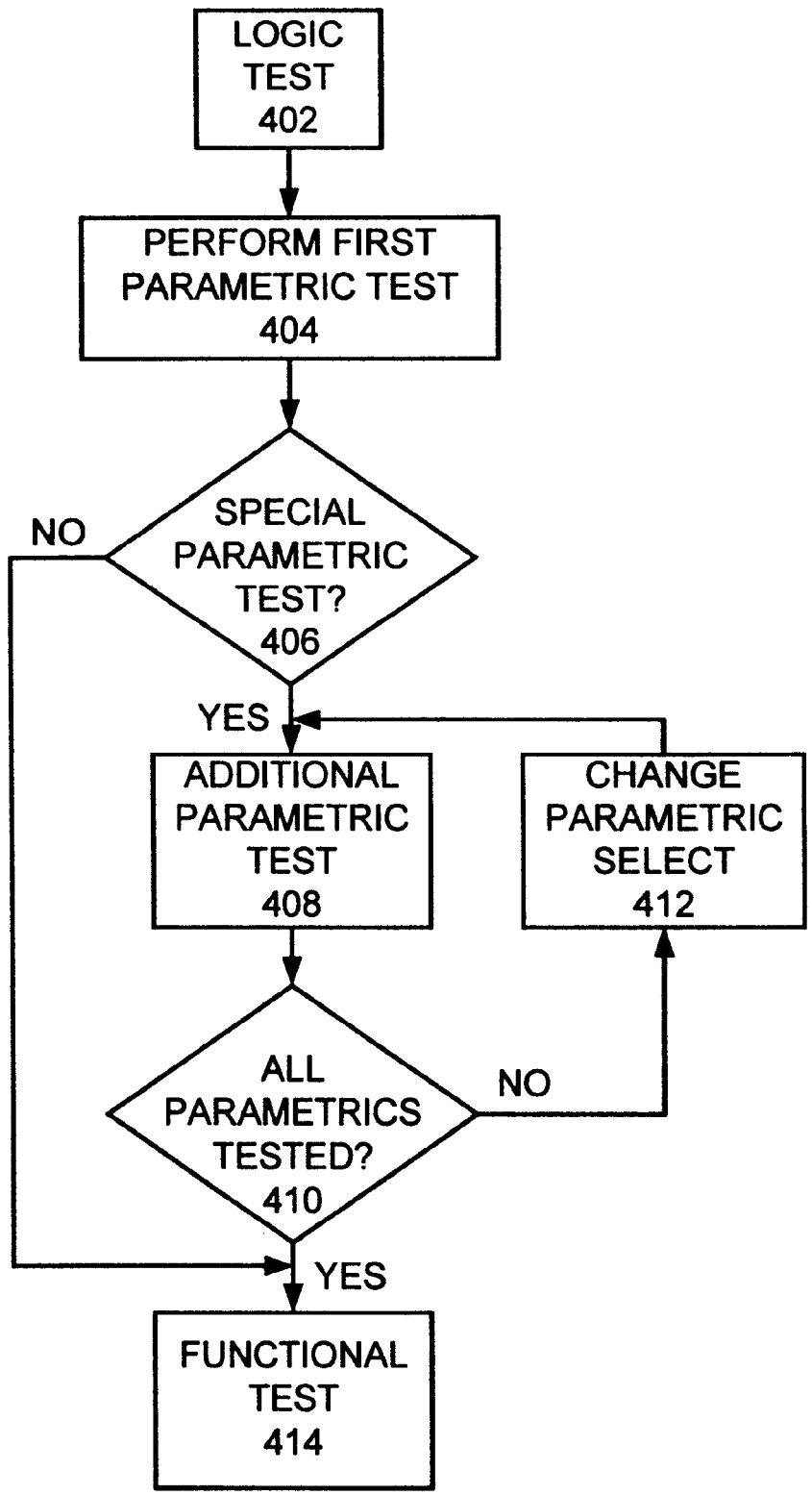
FIG. 4 is a flow chart illustrating a test generation process for the tristate driver/receiver circuit test model of FIG. 3A in accordance with the preferred embodiment.

Referring to FIG. 4, the test generation method of the invention is illustrated. First a logic test is performed as indicated at a block 402. A first parametric test is performed as indicated at a block 404. Test data is generated for each parametric test or each driver/receiver pair using lineholds to keep the variable voltage and/or variable impedance input at a single value during the test. This will test all of the drivers and receivers for the first parametric test at block 404.

After this data is saved, the test generation process is ran again with a linehold on the variable voltage/and or variable impedance inputs at the opposite value. During this portion of the test, only the variable voltage and/or variable impedance drivers are tested. These two groups of test patterns represent the minimal set of test patterns to test these drivers.

As indicated at a decision block 406, checking for special parametric tests is performed. When a special parametric test is needed, then an additional parametric test is performed as indicated at a block 408. Checking whether all parametrics have been tested is performed as indicated at a decision block 410. When all parametrics have not been tested, then the parametric select input is changed as indicated at a block 412. Then the sequential operations continue, returning to block 408 to perform another parametric test. When all parametrics have been tested, then a functional test is performed as indicated at a block 414.

Figure 1:
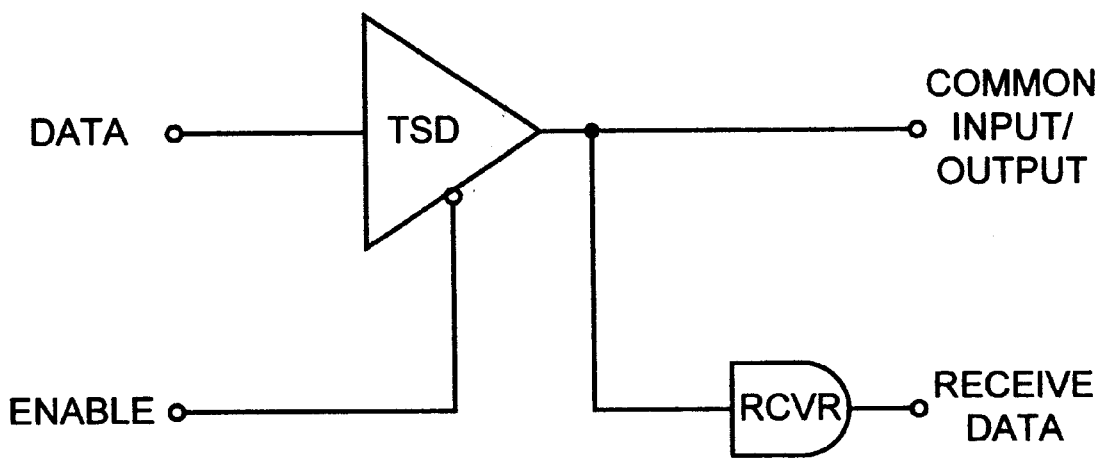
FIG. 1 is a logical test model of a conventional tristate driver/receiver circuit.
Figure 2:
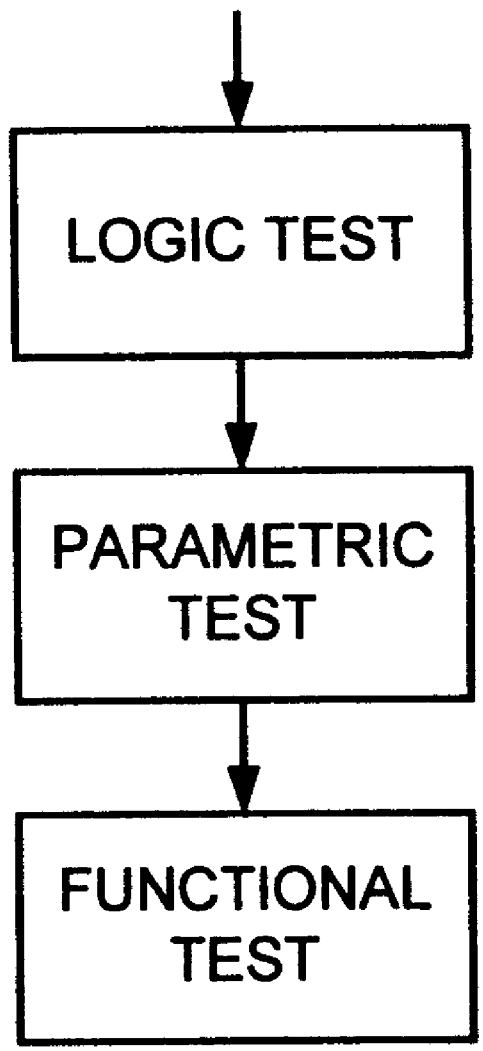
FIG. 2 is a flow chart illustrating a conventional test generation process for the prior art tristate driver/receiver circuit test model of FIG. 1.

The method of the invention saves tester processing time as compared to the prior art test process of FIG. 2. The prior art test model of FIG. 1 only has a single driver and receiver within each book for the technology. This book does not have a variable voltage and/or variable impedance input for the book modeled. To generate test patterns for the inputs, pattern faults are created which will cause a tester to separate the parametric tests from the pattern fault tests to test the inputs. Next two distinct test modes must be created by the tester to separate the parametric tests from the pattern fault tests. In the first test mode, the parametric faults of the drivers and receivers are tested in the default test state with lineholds applied to hold the variable voltage and/or variable impedance inputs constant for this test. After the test patterns are saved, the next set of test patterns are generated in the second test mode with lineholds to keep the variable voltage and/or variable impedance inputs to the opposite value. This time the patterns are generated for logic faults which target not only the pattern faults on these driver/receiver books, but any other undetected faults. This step generates many more test patterns that what is required to test these driver/receiver books. During parametric testing only one pin at a time can be tested which requires much longer processing time at the tester. This also increases the chances of having to remove test patterns from this test section when the test becomes too large to fit within one test buffer. If patterns have to be truncated, there is a chance of not testing all the driver/receiver books.

The parametric testing method of the invention minimizes tester processing time because only one test mode is defined. Only one Test Structure Verification job is required, as compared to the prior art test process of FIG. 2 where two test modes and two Test Structure verification runs are required. Test generation of the invention is more efficient in that for the first set of parametric faults, all of the parametric faults for each driver/receiver is tested, with the exception of the second set in the variable voltage and variable impedance driver/receivers. This step is the same for both processes, except in the method of the invention, a second Good machine and Fault machine model does not have to be generated because there is only one test mode. This again saves tester processing time. The second pass of test generation in the method of the invention only targets the parametric faults in the variable voltage and/or variable impedance drivers. The test data statistics in the prior method is difficult to understand. The first test generation mode of the prior art only indicates that parametric faults are detected. Then the second test generation mode statistics only indicated that stuck at faults and pattern faults were detected without any indication of parametric faults being detected. In the method of the invention, the parametric faults are shown as being detected in each of the test generation runs at blocks 404 and 408.

While the present invention has been described with reference to the details of the embodiments of the invention shown in the drawing, these details are not intended to limit the scope of the invention as claimed in the appended claims.

What is claimed is:

1. A tristate driver/receiver test circuit for parametric testing of variable voltage and variable impedance tristate driver and receiver circuits comprising:

a plurality of tristate driver/receiver pairs; said plurality of tristate driver/receiver pairs representing a plurality of parametrics, said parametrics including multiple voltage and impedance levels;

a decoder for enabling one of said plurality of tristate driver/receiver pairs, said decoder having an input and an output;

said decoder output including a plurality of decoder output lines, each decoder output line coupled to a respective one of said plurality of tristate driver/receiver pairs; and parametric select inputs applied to said decoder input for selecting one of said plurality of tristate driver/receiver pairs.

2. A tristate driver/receiver test circuit for parametric testing of variable voltage and variable impedance tristate driver and receiver circuits as recited in claim 1 wherein said decoder output line is coupled to a tristate driver enable input of said respective one of said plurality of tristate driver/receiver pairs.

3. A tristate driver/receiver test circuit for parametric testing of variable voltage and variable impedance tristate driver and receiver circuits as recited in claim 1 wherein said plurality of tristate driver/receiver pairs include a common tristate driver data input.

4. A tristate driver/receiver test circuit for parametric testing of variable voltage and variable impedance tristate driver and receiver circuits as recited in claim 1 wherein said plurality of tristate driver/receiver pairs include a common tristate driver input/output.

5. A tristate driver/receiver test circuit for parametric testing of variable voltage and variable impedance tristate driver and receiver circuits as recited in claim 4 wherein said plurality of tristate driver/receiver pairs include a common receiver input coupled to said common tristate driver input/output.

6. A tristate driver/receiver test circuit for parametric testing of variable voltage and variable impedance tristate driver and receiver circuits as recited in claim 1 wherein said plurality of tristate driver/receiver pairs include a common receiver data output.

7. A tristate driver/receiver test circuit for parametric testing of variable voltage and variable impedance tristate driver and receiver circuits as recited in claim 1 wherein said decoder output line is coupled to a respective receiver input of said respective one of said plurality of tristate driver/receiver pairs.

8. A method for parametric testing of variable voltage and variable impedance tristate driver and receiver circuits comprising the steps of:

utilizing a tristate driver/receiver test circuit including a plurality of tristate driver/receiver pairs; and a decoder receiving a parametric select input for enabling one of said plurality of tristate driver/receiver pairs; said plurality of tristate driver/receiver pairs representing a plurality of parametrics, said parametrics including multiple voltage and impedance levels;

performing a first parametric test;

checking for special parametric tests;

responsive to identifying special parametric tests, sequentially performing an additional parametric test and changing said parametric select input until all parametrics are tested.

9. A method for parametric testing of variable voltage and variable impedance tristate driver and receiver circuits as recited in claim 8 wherein the step of changing said parametric select input enables a different one of said plurality of tristate driver/receiver pairs.

10. A method for parametric testing of variable voltage and variable impedance tristate driver and receiver circuits as recited in claim 8 further includes the step of performing a logic test before performing said first parametric test.

11. A method for parametric testing of variable voltage and variable impedance tristate driver and receiver circuits as recited in claim 8 further includes the step of performing a functional test after all parametrics are tested.

* * * * *